United States Patent [19]
Miyagi

[11] Patent Number: 5,403,651
[45] Date of Patent: Apr. 4, 1995

[54] INSULATING SUBSTRATE FOR MOUNTING SEMICONDUCTOR DEVICES

[75] Inventor: Masahide Miyagi, Kanagawa, Japan

[73] Assignee: Fuji Electric Co., Ltd., Kanagawa, Japan

[21] Appl. No.: 168,407

[22] Filed: Dec. 17, 1993

Related U.S. Application Data

[63] Continuation-in-part of Ser. No. 953,109, Sep. 29, 1992, abandoned.

[30] Foreign Application Priority Data

Oct. 14, 1991 [JP] Japan .................. 3-264174
Jan. 24, 1992 [JP] Japan .................. 4-010422

[51] Int. Cl.[6] ............................... B32B 9/00
[52] U.S. Cl. ........................... 428/209; 428/210; 428/901
[58] Field of Search ........... 428/688, 901, 209, 627, 428/210, 216

[56] References Cited

U.S. PATENT DOCUMENTS

| | | | |
|---|---|---|---|
| 4,563,383 | 1/1986 | Kuneman | 428/216 |
| 4,696,851 | 9/1987 | Pryor | 428/901 |
| 5,004,640 | 4/1991 | Nakatani et al. | 428/901 |
| 5,043,223 | 8/1991 | Kugamai | 428/901 |
| 5,100,714 | 3/1992 | Zsamboky | 428/901 |
| 5,153,077 | 10/1992 | Kashiba | 428/627 |

FOREIGN PATENT DOCUMENTS 817635 8/1959 United Kingdom .
2201123 8/1988 United Kingdom .

OTHER PUBLICATIONS

Topfer "Thick–Film Microelectronics" Van Nostrand Reinhold 1971 pp. 86–94.
Wittmer, "Mechanical Properties of Liquid Phase Bonded Copper Ceramic Substrates" J. of Amer. Cer. Soc. vol. 65 No. 3 pp. 149–153.
Copy of British Search Report dated Nov. 24, 1992.

Primary Examiner—Patrick J. Ryan
Assistant Examiner—Patrick Jewik
Attorney, Agent, or Firm—Finnegan, Henderson, Farabow, Garrett & Dunner

[57] ABSTRACT

An insulating substrate for mounting semiconductor devices that is composed of a thin flat plate of inexpensive alumina ($Al_2O_3$) preferably in the range of 0.26 to 0.29 mm in thickness. Copper foil sheets are applied to both sides of the flat plate with edges spaced a distance back from the end surface of the plate to increase air path distance between the edges of the sheets of foil applied to opposite sides of the plate. The difference in distance between the end surface of the alumina plate and the edges of each copper foil is 0.5 mm or less to balance thermal stress upon heating and cooling of semiconductors soldered to the copper foil.

6 Claims, 2 Drawing Sheets $R = |A-B|$

FIG. 3
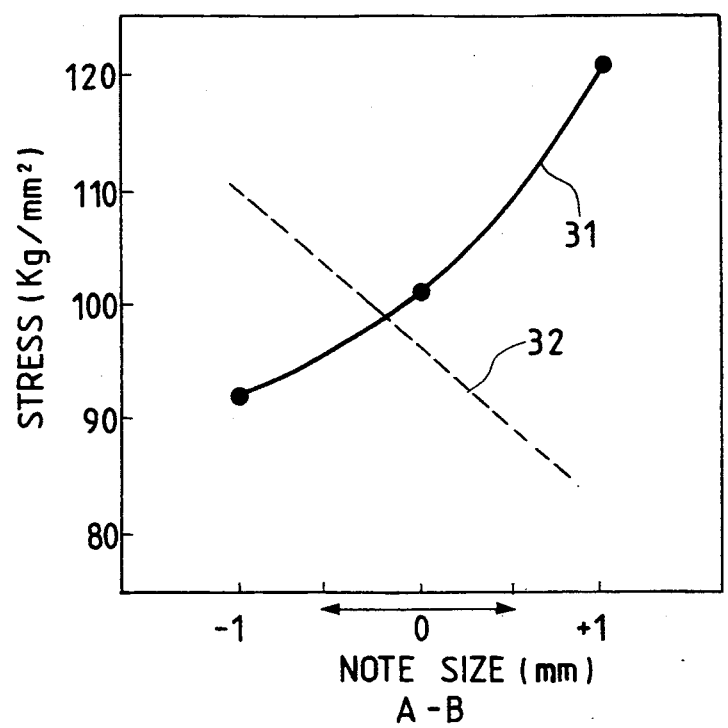
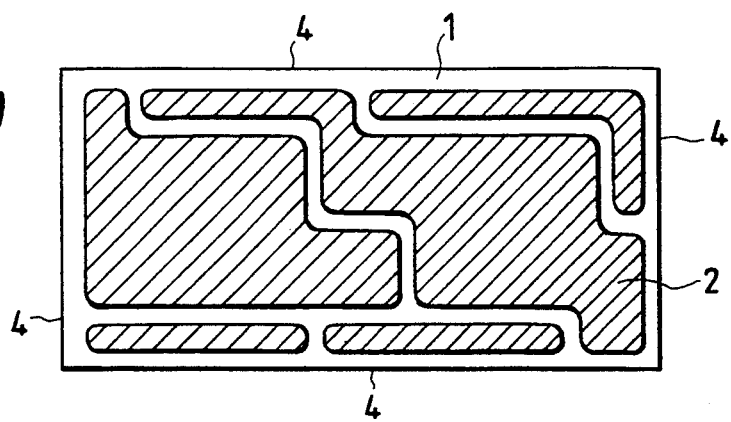
FIG. 4(a)
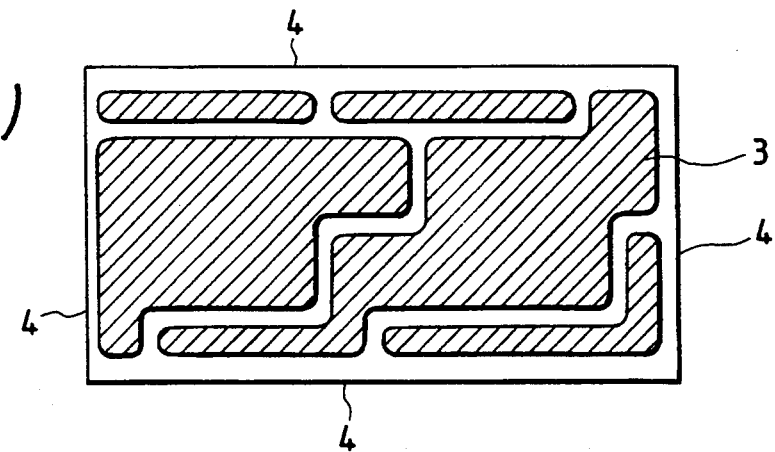
FIG. 4(b)

INSULATING SUBSTRATE FOR MOUNTING SEMICONDUCTOR DEVICES

This application is a continuation-in-part of application Ser. No. 07/953,109, filed Sep. 29, 1992, now abandoned.

BACKGROUND OF THE INVENTION

1. Field of the Invention

The present invention relates to an alumina insulating substrate, to which copper foil is applied, for mounting semiconductor circuit elements such as an inverter of a motor control or air conditioner, or a power module used in NC control, or example.

2. Discussion of the Related Art

Electronic technology has advanced remarkably during the past decade, with rapidly increasing levels of integration and decreasing cost. The primary reason for this trend is that semiconductors have become the primary electronic device. The trend in the area of power modules is to decrease electronic component size and to include more circuitry in a single package. To achieve this goal, circuit elements are mounted on an insulating substrate such that individual circuit elements are electronically isolated from one another. Metal foil is applied to the flat surfaces of the insulating substrate to which electronic components may be soldered. The substrate is usually made of a ceramic material, such as alumina [$Al_2O_3$]. However, as electronic devices have become smaller and more powerful, substrate material having higher thermal conductivity for improved heat dissipation is required.

The thermal conductivity of $Al_2O_3$ is 17 W /[m.k]. The thermal conductivity of aluminum nitride [AlN] is about 5 times greater, 80–140 W/[m.k ]. As a result, an AlN substrate offers higher heat dissipation than an $Al_2O_3$ substrate. However, due to the high cost of AlN, its use has been limited to special applications.

One method for increasing the heat dissipation of an $Al_2O_3$ substrate is to decrease the substrate's thickness. However, as the material's thickness is decreased, its stress resistance also decreases. For example, a conventional $Al_2O_3$ substrate 0.635 mm thick has a bending strength of 8 kg. If the substrate's thickness is reduced to 0.275 mm, the bending strength is only 2 kg, a reduction of 75%. In such a substrate, there is a high probability of cracks developing over time as a result of thermal stress in the assembly.

SUMMARY OF THE INVENTION

The present invention has been made in view of the above circumstances and has as an object to provide an insulating substrate for mounting semiconductor devices in which the insulating substrate is made of inexpensive $Al_2O_3$, whose thermal conductivity is improved by decreasing the ceramic substrate's thickness and to prevent crack formation caused by thermal stress from the heating and cooling of the semiconductor devices.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the insulating substrate for mounting semiconductor devices, of this invention comprises an alumina ($Al_2O_3$) insulating member having first and second opposite flat surfaces terminating at an end surface of the member, a first sheet of metallic foil disposed on the first flat surface having edges terminating first predetermined distances back from the end surface, a second sheet of metallic foil disposed on the second flat surface having edges terminating second predetermined distances back from the end surface, the difference between the first and second corresponding predetermined distances being substantially no greater than 0.5 mm.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

FIG. 3 is a graph of the calculated stress on both flat surfaces of the insulating substrate as a function of the value $A-B$;

FIG. 4($a$) is a plan view showing an example of a Cu foil pattern on the first flat surface of the ceramic substrate of the present invention; and FIG. 4($b$) is a plan view showing an example of a Cu foil pattern on the second flat surface of the ceramic substrate of the present invention.

DETAILED DESCRIPTION OF THE PREFERRED EMBODIMENTS

Figure 1:
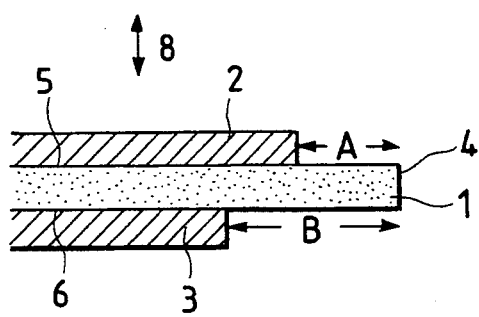
FIG. 1 is a fragmentary cross-sectional view of an insulating substrate in accordance with the present invention.

The purpose of the invention is to prevent crack formation in a Cu-covered $Al_2O_3$ substrate used for mounting semiconductor devices, wherein the thickness of the substrate is decreased to improve the substrate's thermal conductivity.

To obtain adequate electrical isolation between two Cu foil sheets applied to opposite sides of a 0.26–0.29 mm thick alumina plate, the foil edges must not be applied up to the end surface or edge of the alumina plate. If the difference in distance, $A-B$, between the edges of two Cu foil sheets 2 and 3 and end surface 4 of alumina plate 1 is limited to a range of 0.5 mm or less, then the thermal stress on both flat surfaces 5 and 6 of the plate is balanced, and crack formation is prevented. Further, the balance of stress is improved if the Cu foil patterns applied to both flat surfaces 5 and 6 are similar and overlap on the top and bottom of the substrate when viewing the substrate in a vertical direction indicated by arrow 8 of FIG. 1.

To realize the above-mentioned object the present invention provides a semiconductor device, wherein a semiconductor element is mounted on a surface of a flat alumina insulating substrate material, to which copper foil is applied, characterized in that the absolute value in the differences of distances between the edges of Cu foil on both sides and the end surface of the alumina substrate is 0.5 mm or less.

Further, the Cu foil applied to both flat surfaces of the $Al_2O_3$ substrate advantageously has a pattern that overlaps up and down when viewed in a vertical direction shown by arrow 8 in FIG. 1. Additionally, the thickness of the Al$_2$O$_3$ plate is advantageously 0.26 to 0.29 mm.

When Cu foils applied to both sides of an insulating substrate extend up to the end surface of the Al$_2$O$_3$ plate, the separation between the two foil sheets is merely the thickness of the Al$_2$O$_3$ plate, and a breakdown voltage can not be obtained. Thus, to achieve good electrical isolation, the Cu foil sheets are not applied up to the end surface of the Al$_2$O$_3$ substrate. Rather, as shown in FIG. 1, Cu foils 2 and 3 are applied to positions back or inwardly from end surface 4 of Al$_2$O$_3$ plate 1, by the distances A and B, respectively.

When positions of the cracks are detected that are generated by the heating history of the assembly it was found that the crack generated in the Al$_2$O$_3$ plate was below the Cu foil whose edge is farther back from the end surface of the Al$_2$O$_3$ plate 1. The reason for this is that stress in the ceramic varies as a function of temperature. When the distance between the edge of the copper foil on one side of the Al$_2$O$_3$ substrate and the substrate end surface differs from the distance between the edge of the Cu foil on the other side of the Al$_2$O$_3$ substrate and the substrate end surface, the stress is concentrated at the edge of the Cu foil farther back from the Al$_2$O$_3$ substrate end surface.

The tensile stress in a ceramic which is generated in both surfaces of the Al$_2$O$_3$ during the cooling time in the assembly heat history was calculated using the finite element method. The dependency of the stress value in a certain physical constant due to the technically calculated value, on the value of A−B was obtained. The thickness of Al$_2$O$_3$ plate was defined as 0.27 mm and the thickness of Cu foil was defined as 0.25 mm. Stress as a function of the value of A−B was determined and the result is shown in FIG. 3. The line 31 shows the tensile stress of Cu foil 2 on the Al$_2$O$_3$ plate 1; the broken line 32 shows the tensile stress of Cu foil 3 on the Al$_2$O$_3$ plate 1. As the calculations indicate, the tensile stress is greater the farther the foil edge is from the end surface of Al$_2$O$_3$ 1. That is, as shown by the line 31, the tensile stress of the Cu foil 2, which affects the Al$_2$O$_3$ plate 1 during cooling time, increases as the value of A−B becomes large and positive, and it decreases as the value becomes large and negative. Conversely, as shown by the line 32, the tensile stress of the Cu foil 3, which affects the Al$_2$O$_3$ plate 1, decreases as the value of A−B becomes large and positive, and it increases as the value becomes large and negative. From both results, a suitable range for the absolute value of the difference A−B can be found in which cracks will not form in the Al$_2$O$_3$ substrate. Furthermore, when A−B=0 and the top and bottom Cu foil patterns on opposite flat surfaces overlap when viewed from a vertical direction corresponding to arrow 8 of FIG. 1, the stresses of both Cu foils are balanced, with the result that crack formation is significantly reduced.

Figure 2:
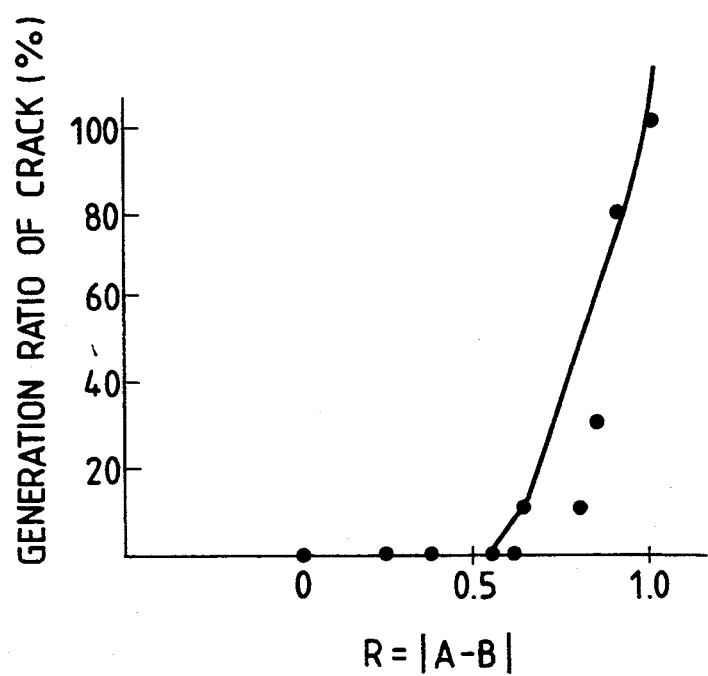
FIG. 2 is a graph of the substrate crack generation ratio as a function of the absolute value of the distance $A-B$ between edges of the Cu foil.

A power module was constructed using a ceramic insulating substrate in which 0.25 mm thick Cu foils 2 and 3 were applied to a 0.275 mm thick Al$_2$O$_3$ plate 1. When the value R=A−B is changed while changing methods of applying Cu foils 2 and 3, cracks were generated in the Al$_2$O$_3$ plate after heating the assembly. FIG. 2 illustrates the relationship between the crack generation ratio and R. As apparent from the drawing, when the value of R is 0.5 mm or less, cracks do not form. When the value of R is greater than 0.5 mm, the generation of cracks sharply increases. Thus, when insulating substrates having a value of R<0.5 mm are prepared, power modules can be produced in which substrate defects do not result.

FIG. 4 shows an example of a top plan view of the first and second flat surfaces of an insulating substrate according to the present invention. The patterns of the Cu foils 2 and 3 applied to the Al$_2$O$_3$ plate 1 have line symmetry form and overlap when viewed from the vertical direction with respect to the surface of the substrate.

The standard practice has been to pattern the Cu foil 2 on the side of the substrate on which circuit elements are mounted, while not patterning the Cu foil 3 on the other side of the substrate which is soldered to a Cu heat sink. However, in the present invention, the Cu foil is patterned on both sides of the substrate, resulting in balanced thermal stress. The Cu foil 3 as well as the soldered layer thereunder are used to dissipate heat from a circuit element to the heat sink substrate. Nevertheless, since the Cu foil 3 always exists just under the element which is mounted on the Cu foil 2, there is no effect on the radiation of heat.

According to the present invention, when the thickness of an insulating substrate on which semiconductor elements are mounted is decreased to improve heat transfer, the stress produced by both Cu foil sheets, which is transferred to the Al$_2$O$_3$ plate, is balanced by setting the absolute value of the difference in distances between the edge of Cu foil and the end surface of the Al$_2$O$_3$ substrate to 0.5 mm or less. Thus, breakage of the Al$_2$O$_3$ plate is decreased, with the result that the high integration and miniaturization can be realized. Further, an improved stress balance can be obtained by overlapping the patterned Cu foils applied to both flat surfaces of the insulating substrate.

The foregoing description of preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An insulating substrate for mounting semiconductor devices thereon, comprising:
    an alumina (AL$_2$O$_3$) insulating member having a thickness in the range of 0.26 to 0.29 millimeters and having first and second opposite flat surfaces terminating at an end surface of the member;
    a first sheet of metallic foil disposed on said first flat surface and having an edge terminating a first distance inwardly of said surface; and
    a second sheet of metallic foil disposed on said second flat surface and having an edge terminating a second distance inwardly of aid end surface, said first and second distances increasing a distance between the edges of the first and second sheets of metallic foil measured along said first, second, and end surfaces of said insulating member to a dimension greater than a thickness of the insulating member, and a difference between said first and second distances being never greater than 0.5 mm to balance thermal stress on said first and second opposite flat surfaces of the insulating member.

2. The substrate of claim 1 wherein said first and second sheets of metallic foil have an overlapping pattern configuration when viewed through the opposite flat surfaces of the member.

3. The substrate of claim 1 wherein the metallic foil is copper (Cu).

4. The substrate of claim 2 wherein the metallic foil is copper (Cu).

5. The substrate of claim 1 wherein the metallic foil is 0.25 millimeters in thickness.

6. The substrate as in claim 1 wherein the first sheet of metallic foil and the second sheet of metallic foil have a substantially similar pattern.

* * * * *

UNITED STATES PATENT AND TRADEMARK OFFICE
CERTIFICATE OF CORRECTION

PATENT NO. : 5,403,651
DATED : April 4, 1995
INVENTOR(S) : Masahide Miyagi

It is certified that error appears in the above-indentified patent and that said Letters Patent is hereby corrected as shown below:

Title page, item [54] and col. 1, title should read--THIN, STRESS-BALANCED INSULATING SUBSTRATE FOR MOUNTING SEMICONDUCTOR DEVICES--.

Column 4, line 62 "aid" should read --said--.

Signed and Sealed this

Twenty-sixth Day of September, 1995

Attest:

BRUCE LEHMAN

*Attesting Officer*  *Commissioner of Patents and Trademarks*